(12) United States Patent
Tomita

(10) Patent No.: US 8,669,648 B2
(45) Date of Patent: Mar. 11, 2014

(54) POWER SEMICONDUCTOR MODULE

(75) Inventor: Yoshihiro Tomita, Osaka (JP)

(73) Assignee: Panasonic Corporation, Osaka (JP)

( * ) Notice: Subject to any disclaimer, the term of this patent is extended or adjusted under 35 U.S.C. 154(b) by 45 days.

(21) Appl. No.: 13/414,086

(22) Filed: Mar. 7, 2012

(65) Prior Publication Data

US 2012/0161303 A1 Jun. 28, 2012

Related U.S. Application Data

(63) Continuation of application No. PCT/JP2010/001885, filed on Mar. 16, 2010.

(30) Foreign Application Priority Data

Oct. 22, 2009 (JP) .................................. 2009-243433

(51) Int. Cl.
*H01L 23/495* (2006.01)

(52) U.S. Cl.
USPC ........... 257/675; 257/672; 257/691; 257/724; 257/E23.044; 257/E23.057

(58) Field of Classification Search
USPC .......... 257/678–733, 672, 675, 676, E23.057, 257/E23.079, 666, E23.031, E23.051, 257/E23.153, 924
See application file for complete search history.

(56) References Cited

U.S. PATENT DOCUMENTS

| 5,107,074 A * | 4/1992 | Noll et al. ..................... 174/551 |
| 5,792,676 A * | 8/1998 | Masumoto et al. ........... 438/111 |
| 7,227,198 B2 * | 6/2007 | Pavier et al. .................. 257/177 |
| 2002/0030532 A1 | 3/2002 | Majumdar et al. |
| 2003/0102506 A1 | 6/2003 | Loddenkotter |

FOREIGN PATENT DOCUMENTS

| JP | 2000-133768 | 5/2000 |
| JP | 2002-043512 | 2/2002 |
| JP | 2003-532295 | 10/2003 |
| JP | 2005-218205 | 8/2005 |
| JP | 2006-303375 | 11/2006 |
| JP | 2009-027883 | 2/2009 |

OTHER PUBLICATIONS

International Search Report issued in International Patent Application No. PCT/JP2010/001885 dated Jun. 22, 2010.

* cited by examiner

*Primary Examiner* — Jasmine Clark
(74) *Attorney, Agent, or Firm* — McDermott Will & Emery LLP

(57) ABSTRACT

A driver IC which is operated by a power supply system insulated from a control IC is mounted in the vicinity of a switching element on a first conductor pattern. A second conductor pattern connected to a source terminal or an emitter terminal of the switching element is electrically connected to a third conductor pattern on which the driver IC is mounted. A ground terminal of the driver IC is electrically connected to the third conductor pattern, and a drive terminal of the driver IC is electrically connected to a gate terminal or a base terminal of the switching element.

13 Claims, 2 Drawing Sheets

POWER SEMICONDUCTOR MODULE

CROSS-REFERENCE TO RELATED APPLICATION

This is a continuation of PCT International Application PCT/JP2010/001885 filed on Mar. 16, 2010, which claims priority to Japanese Patent Application No. 2009-243433 filed on Oct. 22, 2009. The disclosures of these applications including the specifications, the drawings, and the claims are hereby incorporated by reference in their entirety.

BACKGROUND

The present disclosure relates to power semiconductor modules, and specifically, to power semiconductor modules including bidirectional power switching elements used in, for example, power converters.

Power converters are used in various applications, for example, to drive industrial motors, household electric motors, etc., and power semiconductor modules each including a power switching element integrated together with its control element into one semiconductor package are used.

A known example of conventional power semiconductor modules is an inverter module using an insulated gate bipolar transistor (IGBT) as a power switching element. The inverter is a circuit in which a direct-current power supply obtained by rectifying and smoothing an alternating-current power supply is inverted by a power switching element to an alternating current having an arbitrary frequency (see Japanese Patent Publication No. 2000-133768).

Unlike such an inverter, a matrix converter for directly converting an alternating-current power supply to a three-phase alternating current having an arbitrary frequency is used in efforts to improve the energy efficiency of power converters. Since the inverter switches the direct-current power supply, unidirectional power switching elements may be used respectively on a high side and a low side in the inverter. However, in the case of the matrix converter, an alternating-current power supply is directly switched to control an alternate current load, and thus a bidirectional power switching element and a driver for controlling the bidirectional power switching element are required. The bidirectional power switching element can be implemented by, for example, connecting two-element reverse blocking IGBTs inversely parallel. To the gate of each IGBT, a control signal based on the emitter of the IGBT is applied, thereby performing switching control (see Japanese Patent Publication No. 2005-218205).

SUMMARY

In the inverter, alternately turning on and off a direct-current power supply by using switching elements on a high side and a low side can easily generate an alternating current signal. However, in the matrix converter using a switching element (for example, the switching element is a bidirectional switching element), an alternating-current power supply is used as an input, and thus complex switching control in which the timing of an input power supply is adjusted to the timing of a load output and high-speed switching control are required.

A power switching element is opened/closed by applying a driving signal of a driver IC to the gate or the base of the power switching element, where the potential of the source or the emitter of the power switching element is a reference potential. In the case of the inverter, even when a potential with reference to which the switching elements are driven is different from a control ground of the driver IC, polarity with respect to the ground is determined because switching is performed on a direct current, so that it is possible to relatively easily generate a driving signal. However, when a switching element (for example, the switching element is a bidirectional switching element) is used as in the case of the matrix converter, the potential with reference to which the switching element is driven and the polarity of the potential with respect to the control ground of the driver IC are not determined, so that the driver IC is difficult to be formed as a single IC.

Moreover, since a power semiconductor module controls a high-power load, it is important to take the safety of the power semiconductor module into consideration. For example, in the case of the inverter, turning on the switching elements on the high side and the low side at the same time allows a pass-through current, which is a large current, to flow, which are causes of not only breaking the switching elements but also fire. Since the operation of the inverter is simple, it is easy to take safety measures, such as, controlling the switching elements so that they are not turned on at the same time. However, in the case of the matrix converter, the complex and high-speed control is required as described above, and slight malfunction in the driver IC may cause a critical operation mode. Thus, a configuration and control to reduce malfunction have been required.

In view of the foregoing, it is an objective of the present disclosure to obtain high performance and stability of a power semiconductor module including a power switching element such as a matrix converter, and it is also an objective of the present disclosure to integrate functions of the power semiconductor module into a small-size module.

To achieve the objective described above, a configuration of a power semiconductor module of the present disclosure includes: a substrate having a plurality of conductor patterns serving as power leads and control leads; a switching element; and a driver IC configured to drive the switching element, wherein the switching element is mounted on a first conductor pattern of the substrate, a source terminal or an emitter terminal of the switching element is electrically connected to a second conductor pattern forming one of the power leads, the driver IC is mounted on a third conductor pattern electrically connected to the second conductor pattern, the third conductor pattern is in the immediate vicinity of the first conductor pattern, a ground terminal of the driver IC is electrically connected to the third conductor pattern, and a drive terminal of the driver IC is electrically connected to a gate terminal or a base terminal of the switching element.

More preferably, the switching element is made of a bidirectional power semiconductor.

According to the disclosure, the driver IC is arranged in the immediate vicinity of the switching element made of a bidirectional power semiconductor, and a driving signal is applied between the source terminal or the emitter terminal and the gate terminal or the base terminal of the switching element. Thus, stray capacitance around the circuit is minimized, and the delay of the driving signal can be reduced. This makes it possible to perform high-speed switching control. Moreover, the driver IC operates at the same reference potential as the source terminal or the emitter terminal whose potential is a reference potential for driving the switching element. Thus, the switching element can be controlled in such a manner that is less susceptible to the influence of voltage fluctuation of peripheral circuits and causes no malfunction. Moreover, the driver IC is mounted on the third conductor pattern electrically connected to the reference potential. Thus, shielding effect of the third conductor pattern stabilizes potential around the driver IC, which can reduce malfunction.

More preferably, the drive terminal of the driver IC is directly connected to the gate terminal or the base terminal of the switching element by a bonding wire. With this configuration, the stray capacitance can further be reduced, and disturbance can be reduced, so that high-speed driving by switching can be achieved without malfunction.

More preferably, the third conductor pattern on which the driver IC is mounted is adjacent to the first conductor pattern on which the switching element is mounted. With this configuration, the stray capacitance can further be reduced, and disturbance can be reduced, so that high-speed driving by switching can be achieved without malfunction.

More preferably, the second conductor pattern and the third conductor pattern form a continuous identical conductor pattern. With this configuration, disturbance to the reference potentials of the driver IC and the switching element can be reduced, so that driving without malfunction can be achieved.

More preferably, a metal block serving as a heat spreader on which the switching element is mounted is mounted on the first conductor pattern. With this configuration, heat dissipation of the switching element is improved, so that the limit of allowable power dissipation can be increased.

More preferably, a fourth conductor pattern to which a power supply terminal of the driver IC is electrically connected extends adjacent to the second conductor pattern serving as one of the power leads, and a capacitor is connected between the second conductor pattern and the fourth conductor pattern. With this configuration, the voltage between the reference potential of the driver IC and the power supply can be stabilized, so that driving by switching can be achieved with malfunction being reduced.

More preferably, the capacitor connected between the second conductor pattern and the fourth conductor pattern is incorporated in the module. With this configuration, the power supply for operating the driver IC can be stabilized in the immediate vicinity of the driver IC, so that driving by switching can be achieved with malfunction being reduced.

More preferably, the second conductor pattern and the fourth conductor pattern extend parallel to each other to the outside of the module to form two of the power leads so that the capacitor is allowed to be externally provided between the second conductor pattern and the fourth conductor pattern. With this configuration, even when the capacitor cannot be incorporated in the power semiconductor module, the second conductor pattern whose potential is a reference potential for driving the switching element is adjacent to the power supply terminal of the driver IC on the outside of the module, and the capacitor can be externally provided, so that driving by switching can be achieved without malfunction.

More preferably, a position in which the driver IC is mounted on the third conductor pattern is closer to the power leads than a position in which the switching element is mounted on the first conductor pattern is. With this configuration, the driver IC can be mounted in the immediate vicinity of the second conductor pattern whose potential is a reference potential for driving the driver IC, so that driving by switching can be achieved with malfunction being reduced. Moreover, when the capacitor for stabilizing the power supply of the driver IC is externally provided, the driver IC can be arranged in the more immediate vicinity of the capacitor, so that driving by switching can be achieved with malfunction being reduced.

More preferably, the power leads are collected on one side of the module, and the control leads are collected on the other side of the module so that the power leads are spaced from the control leads to satisfy a withstand voltage. With this configuration, it is possible to obtain a power semiconductor module satisfying a withstand voltage required between the power leads and the control leads.

More preferably, the substrate having the plurality of conductor patterns is made of a lead frame. With this configuration, the external connectivity of the module can be ensured.

More preferably, the substrate having the plurality of conductor patterns is made of an insulated metal base substrate. With this configuration, heat dissipation of the switching element can be improved, while the external connectivity of the module is ensured.

As described above, in the present disclosure, a switching element including a bidirectional power semiconductor and a driver IC are arranged so that the stray capacitance around the circuit is minimized, and a high-speed switching control can be achieved. Moreover, reference potentials for driving the switching element and the driver IC are stabilized, and disturbance to the driver IC is reduced. With this configuration, driving by switching can be achieved without malfunction, so that it is possible to obtain a power semiconductor module having high performance, stability, and safety of operation.

DETAILED DESCRIPTION

Figure 1:
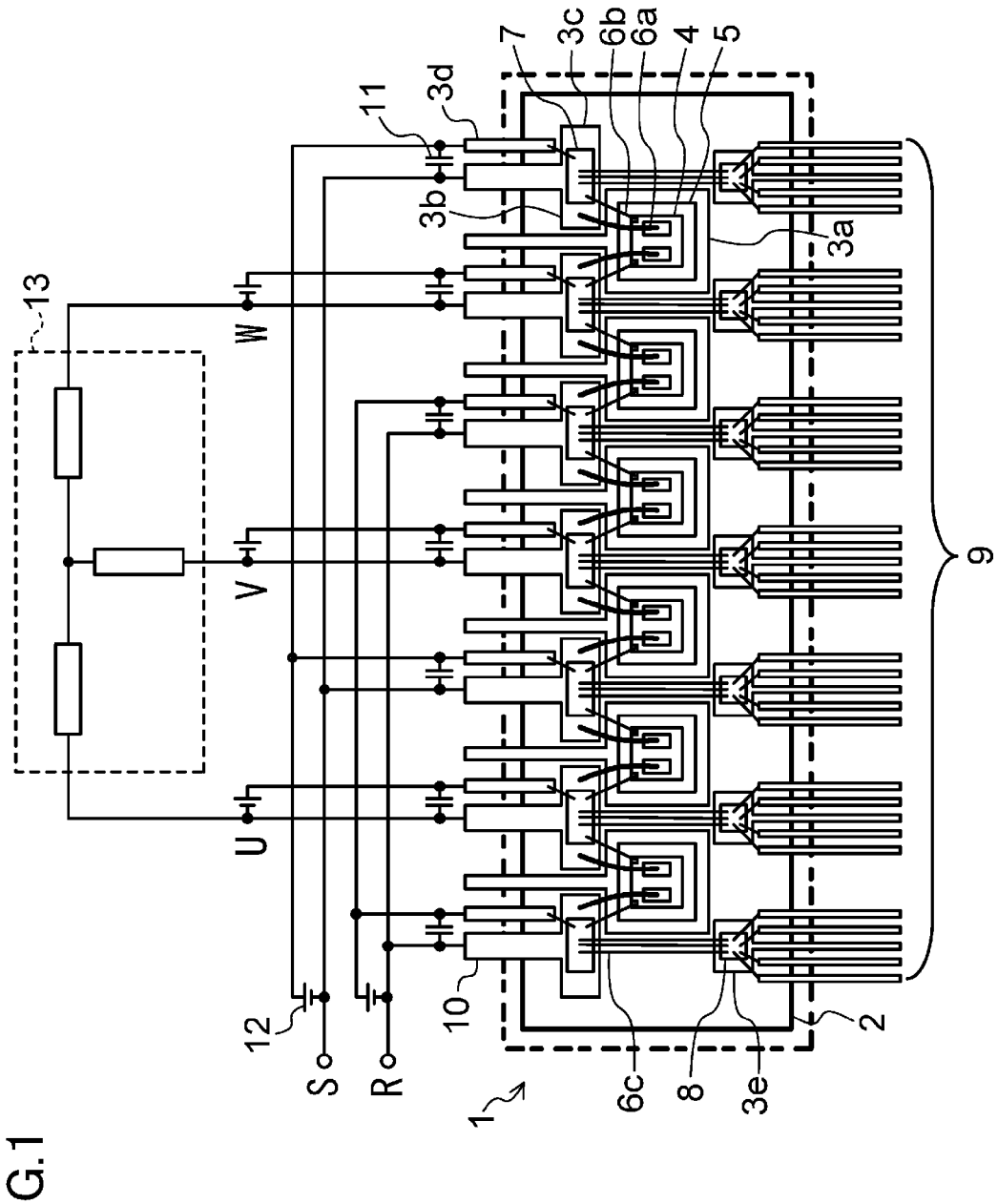
FIG. 1 is a plan view illustrating a power semiconductor module of an embodiment of the present disclosure.

FIG. 1 is a plan view illustrating a power semiconductor module of an embodiment of the present disclosure, wherein the area surrounded by a bold broken line represents a housing portion of a power semiconductor module 1, and in order to clearly show the internal structure of the housing portion, a housing is not illustrated.

The power semiconductor module 1 of the present disclosure uses, as an insulated metal base substrate 2, a substrate in which lead frames are adhered via insulating resin to a metal plate serving as a heat dissipating plate of the module to form first to fifth conductor patterns 3a-3e.

As a switching element 4 for switching power, a switching element including a bidirectional power semiconductor is used. Here, bidirectional switching is performed by a double-gate gate injection transistor (GIT) containing GaN. Alternatively, bidirectional switching may be performed by connecting two-element reverse blocking IGBTs inversely parallel as in the case of conventional examples. The bidirectional switching element 4 is first mounted on a heat spreader 5 serving as a metal block by soldering, and then the heat spreader 5 provided with the switching element 4 is mounted on each of the first conductor patterns 3a by soldering. A source terminal or an emitter terminal of the switching element 4 is electrically connected to the corresponding second conductor pattern 3b via a bonding wire 6a made of, for example, aluminum.

A driver IC 7 is mounted on each of the third conductor patterns 3c by soldering, where the third conductor pattern 3c is adjacent to the corresponding first conductor pattern 3a on which the switching element 4 is mounted. An operation ground pad of the driver IC 7 is electrically connected to the third conductor pattern 3c via a bonding wire (not shown), and a signal pad of the driver IC 7 for driving the switching element 4 is directly connected to a gate pad or a base pad of the switching element 4 via a bonding wire 6b. Here, the second conductor pattern 3b and the third conductor pattern 3c form an electrically connected identical conductor pattern, which is connected to the source or the emitter of the switching element 4 and has a potential with reference to which a driving signal is applied to the gate or the base of the switching element 4. Thus, when the third conductor pattern 3c is used as a reference ground to operate the driver IC 7, the switching element 4 can be driven in such a manner that is less susceptible to the disturbance and causes no malfunction. Moreover, the driver IC 7 is mounted on the third conductor pattern 3c whose potential is a reference potential, so that shielding effect against environmental disturbance can be expected. Furthermore, the driver IC 7 is arranged adjacent to the switching element 4, and is directly connected to the switching element 4 via the bonding wire 6b, so that undesirable stray capacitance is not added, which makes it possible to stably perform high-speed switching control.

Further, a control IC 8 for controlling the driver IC 7 is mounted on each of the fifth conductor patterns 3e, and the driver IC 7 is directly connected to the control IC 8 via a bonding wire 6c.

On one side of the contour of the power semiconductor module 1, control leads 9 are arranged. The control leads 9 are externally exposed portions of the lead frames serving as the conductor patterns included in the insulated metal base substrate 2. Some of these control leads 9 are electrically connected to the control IC 8, and power is supplied and a control signal is input externally to the control IC 8 via the control leads 9.

On the other side of the power semiconductor module 1, power leads 10 such as alternating-current power supply input terminals R, S and alternate current load output terminals U, V, W are arranged. The power leads 10 are externally exposed portions of the lead frames serving as the conductor patterns which are included in the insulated metal base substrate 2, and some of the power leads 10 are connected to the switching element 4, or the like. The alternating-current power supply input terminals R, S are connected to a single-phase alternating-current power supply, and the alternate current load output terminals U, V, W are connected to a three-phase alternating current load 13. The power leads 10 function as input/output terminals for power conversion controlled by opening/closing the switching element 4.

Moreover, the power leads 10 include a terminal formed by extending the fourth conductor pattern 3d electrically connected to a power supply pad of the driver IC 7, and a terminal formed by the third conductor pattern 3c electrically connected to the ground pad of the driver IC 7, wherein between both the terminals, power for operating the driver IC 7 is supplied from an external power supply 12, and a capacitor 11 is further arranged. In this way, the power supply to and operation of the driver IC 7 are stabilized. When a position in which the capacitor 11 is provided is closer to the driver IC 7, disturbance to the power supply to the driver IC 7 is less, so that malfunction can be prevented.

In the configuration illustrated in FIG. 1, the power leads 10 are collected on one side of the power semiconductor module 1, and the control leads 9 are collected on the other side of the power semiconductor module 1. As a result, the power leads 10 are spaced from the control leads 9 to satisfy a withstand voltage.

Moreover, the driver IC 7 is mounted on a side which is closer to one of the power leads 10 than the switching element 4 is so that the externally provided capacitor 11 can be arranged in the immediate vicinity of the driver IC 7. In this way, the power supply to the driver IC 7 is further stabilized, and disturbance is reduced, so that malfunction can be prevented.

The capacitor 11 is externally provided in FIG. 1, but by the technique of incorporating components, a chip capacitor may be mounted between the third conductor pattern 3c and the fourth conductor pattern 3d so that the chip capacitor is incorporated in the power semiconductor module 1, which can further stabilize the power supply for operation of the driver IC 7.

Moreover, as described above, the driver IC 7 operates by a power supply and a ground based on the source or the emitter of the corresponding switching element 4, and thus each of the driver IC 7 operates at a different ground, so that the driver ICs 7 have to be dielectrically isolated from each other. Moreover, the control IC 8 operates by a power supply and a ground of a control system which are different from those of the driver IC 7, and the control ICs 8 are dielectrically isolated from each other and are driven by the driver ICs 7 arranged in the immediate vicinity of the switching elements 4, so that electrical interference between the control ICs 8 can be reduced, and malfunction can be reduced.

Note that power for operating the driver IC 7 is supplied from the external power supply 12 in the present disclosure, but an internal power supply can be formed by transferring power from the control IC 8 to the driver IC 7 by using an isolation transformer.

Figure 2:
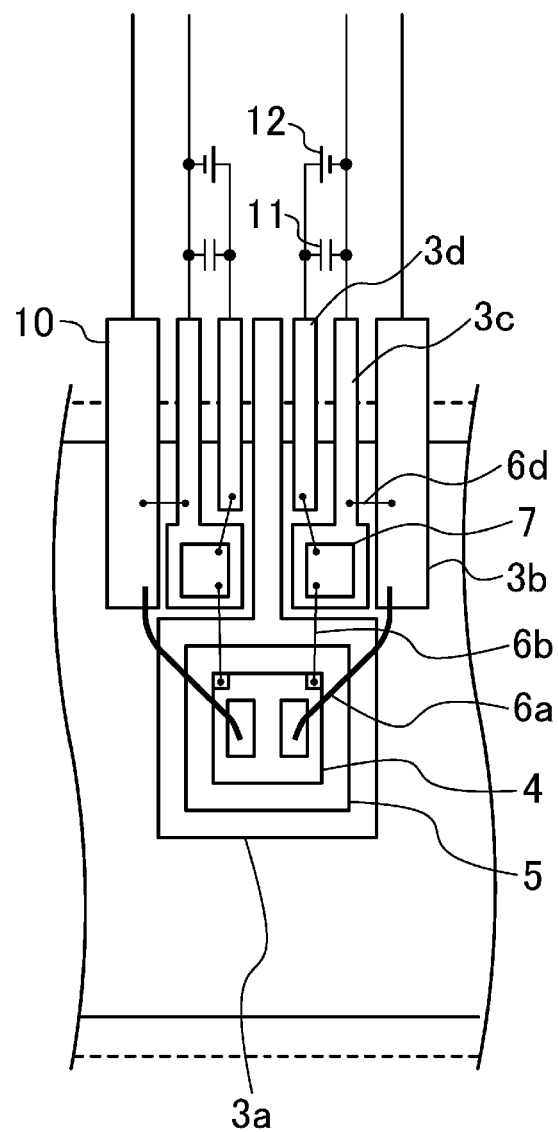
FIG. 2 is an enlarged view illustrating a part of a variation of the power semiconductor module of FIG. 1.

FIG. 2 is an enlarged plan view of a part of a variation of the power semiconductor module of FIG. 1. According to FIG. 2, a second conductor pattern 3b connected to a source terminal or an emitter terminal of a switching element 4 is separated from a third conductor pattern 3c on which a driver IC 7 is mounted, and both the conductor patterns 3b, 3c are electrically connected to each other by a bonding wire 6d. The other configurations are similar to those of FIG. 1, and advantages similar to those of FIG. 1 can be obtained.

As described above, according to the present disclosure, in a power converter such as a matrix converter, in which using a bidirectional power switching element has been difficult by conventional techniques, a driver IC can be integrated in the immediate vicinity of a switching element, and high-speed control, stability, and safety of operation of the switching element can be achieved.

What is claimed is:
1. A power semiconductor module comprising:
 a substrate having a plurality of conductor patterns serving as power leads and control leads;
 a switching element; and
 a driver IC configured to drive the switching element, wherein
 the switching element is mounted on a first conductor pattern of the substrate,
 a source terminal or an emitter terminal of the switching element is electrically connected to a second conductor pattern forming one of the power leads,
 the driver IC is mounted on a third conductor pattern electrically connected to the second conductor pattern,
 the third conductor pattern is in the immediate vicinity of the first conductor pattern,
 a ground terminal of the driver IC is electrically connected to the third conductor pattern, and
 a drive terminal of the driver IC is electrically connected to a gate terminal or a base terminal of the switching element.

2. The power semiconductor module of claim 1, wherein the drive terminal of the driver IC is directly connected to the gate terminal or the base terminal of the switching element by a bonding wire.

3. The power semiconductor module of claim 1, wherein the third conductor pattern on which the driver IC is mounted is adjacent to the first conductor pattern on which the switching element is mounted.

4. The power semiconductor module of claim 1, wherein the second conductor pattern and the third conductor pattern form a continuous identical conductor pattern.

5. The power semiconductor module of claim 1, wherein a metal block which serves as a heat spreader and on which the switching element is mounted on the first conductor pattern.

6. The power semiconductor module of claim 1, wherein
a fourth conductor pattern to which a power supply terminal of the driver IC is electrically connected extends adjacent to the second conductor pattern serving as one of the power leads, and
a capacitor is connected between the second conductor pattern and the fourth conductor pattern.

7. The power semiconductor module of claim 6, wherein the capacitor connected between the second conductor pattern and the fourth conductor pattern is incorporated in the module.

8. The power semiconductor module of claim 6, wherein the second conductor pattern and the fourth conductor pattern extend parallel to each other to the outside of the module to form two of the power leads so that the capacitor is allowed to be externally provided between the second conductor pattern and the fourth conductor pattern.

9. The power semiconductor module of claim 1, wherein a position in which the driver IC is mounted on the third conductor pattern is closer to the power leads than a position in which the switching element is mounted on the first conductor pattern is.

10. The power semiconductor module of claim 1, wherein the power leads are collected on one side of the module, and the control leads are collected on the other side of the module so that the power leads are spaced from the control leads to satisfy a withstand voltage.

11. The power semiconductor module of claim 1, wherein the substrate having the plurality of conductor patterns is made of a lead frame.

12. The power semiconductor module of claim 1, wherein the substrate having the plurality of conductor patterns is made of an insulated metal base substrate.

13. The power semiconductor module of claim 1, wherein the switching element is made of a bidirectional power semiconductor.

* * * * *